United States Patent
Hsu et al.

(10) Patent No.: US 8,765,556 B2
(45) Date of Patent: Jul. 1, 2014

(54) METHOD OF FABRICATING STRAINED STRUCTURE IN SEMICONDUCTOR DEVICE

(75) Inventors: Yu-Rung Hsu, Tainan (TW); Chen-Hua Yu, Hsin-Chu (TW); Chao-Cheng Chen, Shin-Chu (TW); Ming-Huan Tsai, Zhubei (TW); Hsien-Hsin Lin, HsinChu (TW); Hsueh-Chang Sung, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 587 days.

(21) Appl. No.: 12/645,834

(22) Filed: Dec. 23, 2009

(65) Prior Publication Data

US 2011/0147810 A1 Jun. 23, 2011

(51) Int. Cl.
*H01L 21/336* (2006.01)
(52) U.S. Cl.
USPC .......................................... 438/285; 438/300
(58) Field of Classification Search
USPC .......................................... 438/285, 295, 300
See application file for complete search history.

(56) References Cited

U.S. PATENT DOCUMENTS

| 5,336,903 | A  | * | 8/1994 | Ozturk et al. ............... 257/19 |
| 7,195,985 | B2 |   | 3/2007 | Murthy et al. |
| 2002/0122100 | A1 | * | 9/2002 | Nordstrom et al. ............ 347/65 |
| 2005/0074941 | A1 | * | 4/2005 | Nagatomo ............... 438/301 |
| 2005/0148147 | A1 | * | 7/2005 | Keating et al. ............... 438/299 |
| 2007/0249168 | A1 |   | 10/2007 | Rotondaro et al. |
| 2007/0281493 | A1 | * | 12/2007 | Fucsko et al. ............... 438/739 |
| 2008/0001182 | A1 | * | 1/2008 | Chen et al. ............... 257/255 |

* cited by examiner

*Primary Examiner* — Matthew Reames
(74) *Attorney, Agent, or Firm* — Haynes and Boone, LLP

(57) ABSTRACT

The present disclosure provides a semiconductor device that includes a semiconductor substrate, a gate structure disposed on a portion of the substrate, and strained structures disposed at either side of the portion of the substrate and formed of a semiconductor material different from the semiconductor substrate. The portion of the substrate is T shaped having a horizontal region and a vertical region that extends from the horizontal region in a direction away from a surface of the substrate.

20 Claims, 20 Drawing Sheets

METHOD OF FABRICATING STRAINED STRUCTURE IN SEMICONDUCTOR DEVICE

BACKGROUND

When a semiconductor device such as a metal-oxide-semiconductor field-effect transistors (MOSFETs) is scaled down through various technology nodes, high k dielectric material and metal are adopted to form a gate stack. In addition, strained structures utilizing epitaxy silicon germanium (SiGe) may be used to enhance carrier mobility. However, current techniques to form these strained structures have not been satisfactory in all respects. For example, these strained structures may not produce enough stress in a channel region to improve the device performance.

SUMMARY

One of the broader forms of an embodiment of the present invention involves a semiconductor device. The semiconductor device includes a semiconductor substrate; a gate structure disposed on a portion of the substrate; and strained structures disposed at either side of the portion of the substrate and formed of a semiconductor material different from the semiconductor substrate. The portion of the substrate is T shaped having a horizontal region and a vertical region that extends from the horizontal region in a direction away from a surface of the substrate.

Another one of the broader forms of an embodiment of the present invention involves a method of fabricating a semiconductor device. The method includes providing a semiconductor substrate; forming a gate structure on a surface of the substrate, the gate structure including a spacer disposed on a sidewall of the gate structure; performing a dry etching to form a recess in the substrate, wherein the recess is U shaped having a side aligned with the spacer; performing a wet etching with selectivity modulation to modify the recess such that the gate structure is disposed on a portion of the substrate, wherein the portion of the substrate is T shaped having a horizontal region and a vertical region that extends from the horizontal region in a direction away from the surface of the substrate; and filling the recess with a semiconductor material different from the semiconductor substrate.

Yet another one of the broader forms of an embodiment of the present invention involves a semiconductor device. The semiconductor device includes a semiconductor substrate and a PMOS transistor. The PMOS transistor includes a gate structure disposed on a surface of the substrate, spacers disposed on sidewalls of the gate structure, respectively, and strained source and drain regions disposed within the substrate at either side of the gate structure, the strained source and drain regions being formed of a semiconductor material different from the substrate. A portion of the substrate is disposed between the strained source and drain regions, wherein the portion of the substrate includes a horizontal region and a vertical region that extends from the horizontal region in a direction away from the surface of the substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
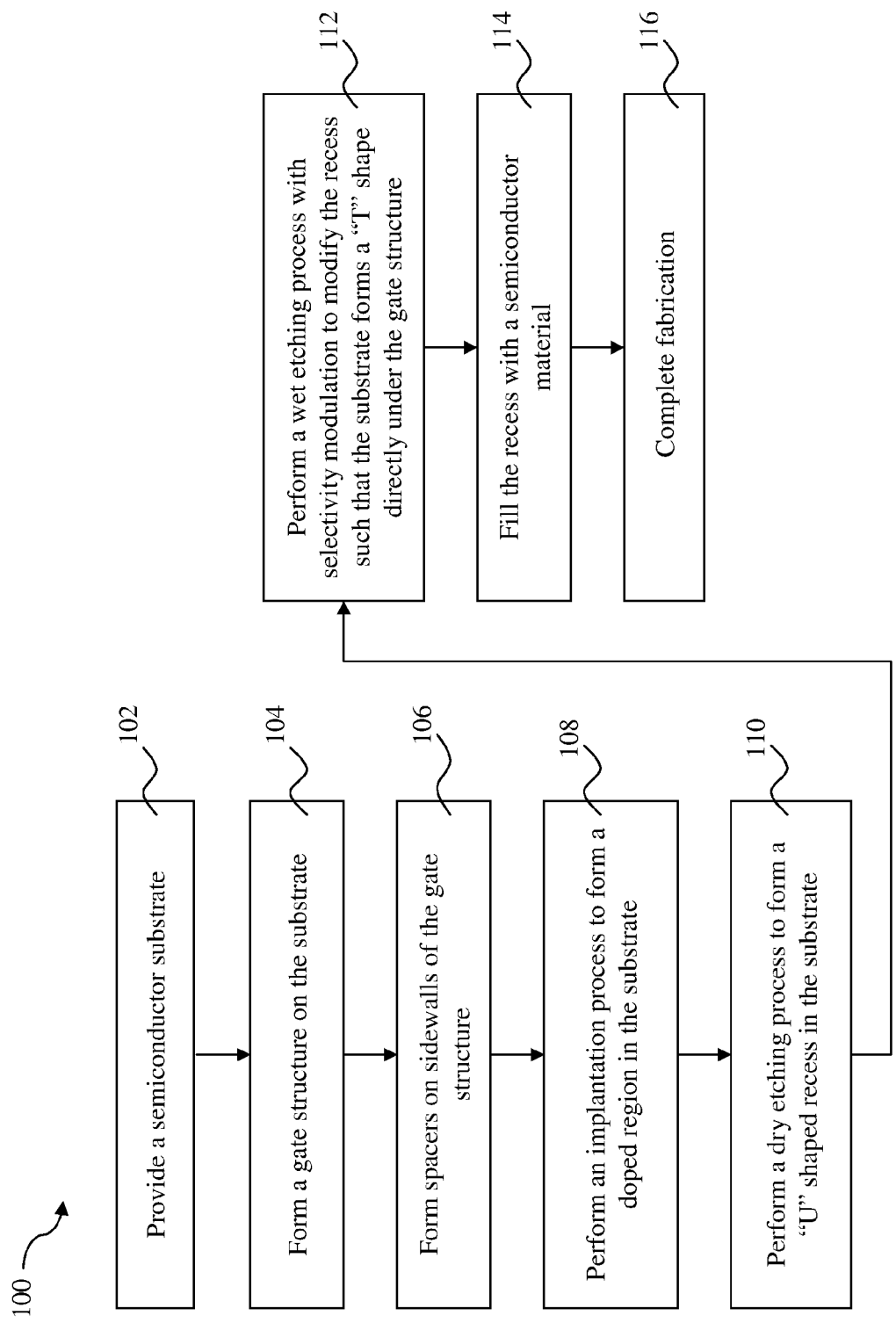
FIG. 1 is a flow chart of a method of fabricating a semiconductor device having strained features according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flow chart of a method 100 of fabricating a semiconductor device according to various aspects of the present disclosure. The method 100 begins with block 102 in which a semiconductor substrate is provided. The method 100 continues with block 104 in which a gate structure is formed on a surface of the substrate. The method 100 continues with block 106 in which spacers are formed on sidewalls of the gate structure. The method continues with block 108 in which an implantation process is performed to form a doped region in the substrate. The method 100 continues with block 110 in which a dry etching process is performed to form a "U" shaped recess in the substrate. The method 100 continues with block 112 in which a wet etching process with selectivity modulation is performed to modify the recess such that the substrate forms a "T" shape directly under the gate structure. The method 100 continues with block 114 in which the recess is filled with a semiconductor material. The method 100 continues with block 116 in which fabrication of the semiconductor device is completed. The discussion that follows illustrates various embodiments of a semiconductor device that can be fabricated according to the method 100 of FIG. 1.

Figure 2A:
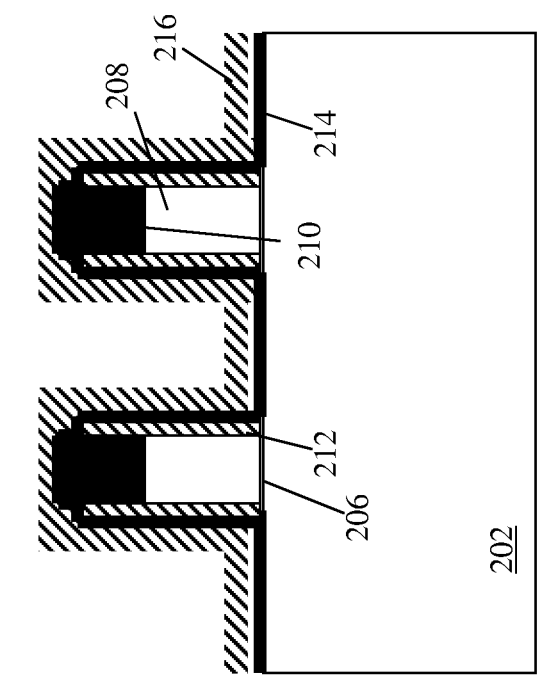
FIGS. 2A-2E are cross-sectional views of an embodiment of a semiconductor device at various stages of fabrication according to the method of FIG. 1.

Referring to FIGS. 2A-2E, illustrated is an embodiment of a semiconductor device 200 at various stages of fabrication according to the method 100 of FIG. 1. It is understood that FIGS. 2A-2E have been simplified for the sake of clarity to better understand the inventive concepts of the present disclosure. In FIG. 2A, the semiconductor device 200 includes a substrate 202. The substrate 202 includes a silicon substrate.

In another embodiment, the semiconductor substrate 202 may include an epitaxial layer. For example, the substrate 202 may have an epitaxial layer overlying a bulk semiconductor. The substrate 202 further includes doped regions such as p-wells and n-wells. Furthermore, the substrate 202 may include a semiconductor-on-insulator (SOI) structure such as a buried dielectric layer. Alternatively, the substrate 202 may include a buried dielectric layer such as a buried oxide (BOX) layer, such as that formed by a method referred to as separation by implantation of oxygen (SIMOX) technology, wafer bonding, selective epitaxial growth (SEG), or other proper method. The semiconductor device 200 includes active regions defined in the substrate 202.

Various shallow trench isolation (STI) structures are formed in the semiconductor substrate 202 for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor (NMOS and PMOS) field-effect transistors. The operational devices are configured as an array of NMOS devices and an array of PMOS devices. The NMOS and PMOS devices may be fabricated by CMOS technology processing. Accordingly, it is understood that additional processes may be provided before, during, and after the method 100 of FIG. 1, and that some other processes may only be briefly described herein. Each NMOS and PMOS device includes a gate structure formed on the semiconductor substrate 202. In the present embodiment, only PMOS devices are illustrated for the sake of clarity. It is understood that the NMOS devices in other regions of the substrate 202 may be protected by a photoresist or other suitable protection layer during formation of the strained features in the PMOS devices.

The gate structure includes a gate dielectric 206 and a gate electrode. The gate dielectric 206 may include silicon oxide, silicon nitride, high-k dielectric, or other suitable material. The high-k dielectric layer may include a binary or ternary high-k film such as HfOx. Alternatively, the high-k dielectric layer 216 may optionally include other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides, or other suitable materials. The gate dielectric 206 is formed by a suitable process such as an atomic layer deposition (ALD), chemical vapor deposition (CVD), physical vapor deposition (PVD), thermal oxidation, UV-ozone oxidation, or combinations thereof.

The gate electrode 208 may include polysilicon (or poly). For example, silane (SiH4) may be used as a chemical gas in a CVD process to form the poly. The poly layer may include a thickness ranging from about 400 to about 800 Angstrom (Å). Alternatively, the gate electrode 208 layer may include a metal such as Al, Cu, W, Ti, Ta, TiN, TaN, NiSi, CoSi, other suitable conductive materials, or combinations thereof. The gate structure may further include a hard mask layer 210 formed on the gate electrode 208. The hard mask layer 210 include silicon oxide. Alternatively, the hard mask layer 210 may optionally silicon nitride, silicon oxynitride, and/or other suitable dielectric materials, and may be formed using a method such as CVD or PVD. The hard mask layer 210 may include a thickness ranging from about 100 to about 800 Angstrom (Å).

The semiconductor device 200 includes a sealing layer 212 formed on each sidewall of the gate structures. The sealing layer 212 includes silicon nitride and has a thickness ranging from about 4 to about 6 nm. The sealing layer 212 may be formed by CVD, PVD, ALD, plasma enhanced CVD (PECVD), or other suitable technique. The sealing layer 212 may function to protect the gate structure during subsequent processing.

The semiconductor device 200 further includes an oxide layer 214 formed over the substrate 202 and the gate structures. The oxide layer 214 may be formed by CVD, PVD, ALD, or other suitable technique. The oxide layer 214 includes a thickness ranging from about 2 to about 4 nm. The semiconductor device 200 further includes a nitride layer 216 formed over the oxide layer 214. The nitride layer 216 may be formed by CVD, PVD, ALD, or other suitable technique. The nitride layer 216 includes a thickness ranging from about 10 to about 15 nm.

Figure 2B:
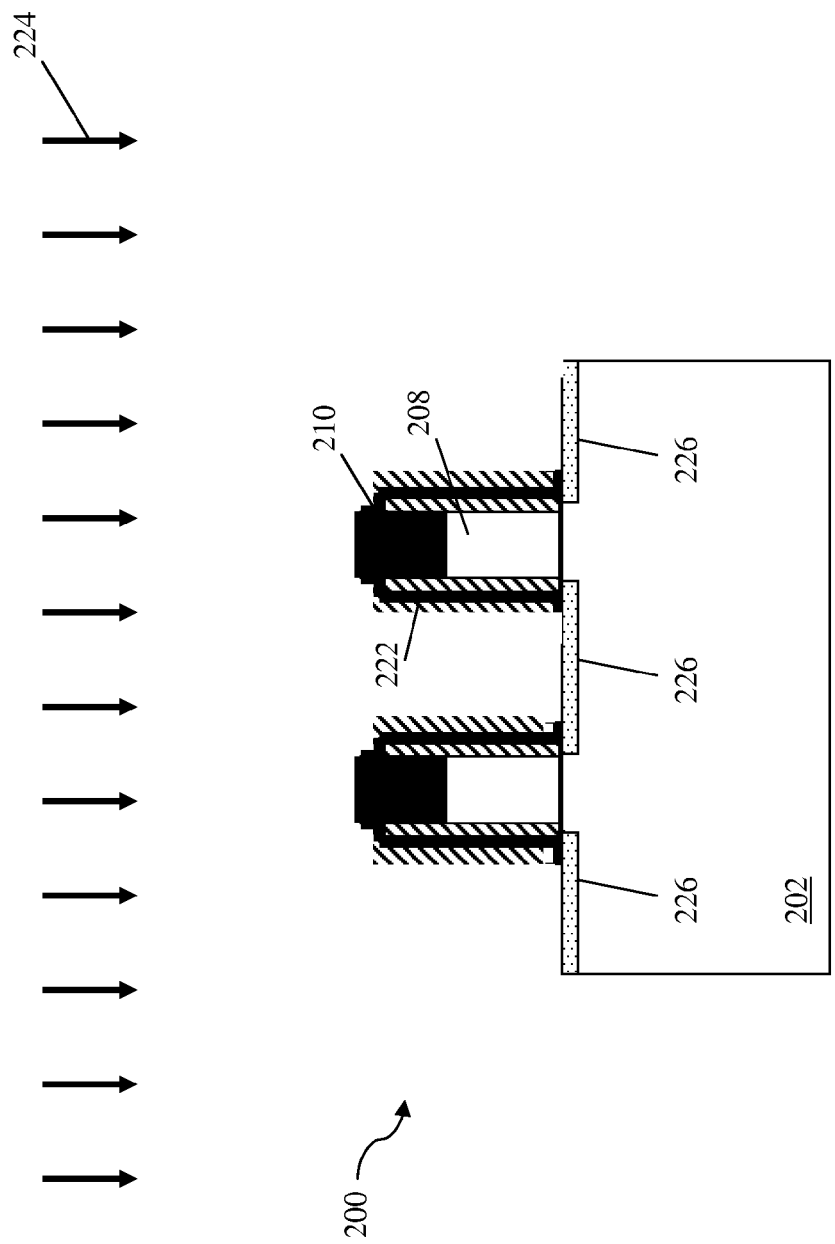

In FIG. 2B, an etching process is performed to form spacers on sidewalls of the gate structure of the PMOS devices. In the present embodiment, a dry etching (e.g., anisotropic etching) is performed on the oxide layer 214 and the nitride layer 216 to form the spacers 222. The spacers 222 have a thickness ranging from about 5 to about 30 nm. Alternatively, the spacers 222 may be formed of other dielectric materials such as silicon oxynitride and silicon carbon nitride.

An implantation process 224 is performed to form a doped region 226 in the substrate 202. In the present embodiment, the implant process 224 implants B with an energy ranging from about 1 KeV to about 5 KeV, a dosage ranging from about 1E13 atoms/cm$^2$ to about 3E13 atoms/cm$^2$, and a tilt angle ranging from about 35° to about 45°. It should be noted that the implantation process 224 serves a different purpose than an implantation process that is typically performed to form lightly doped drain (LDD) regions in the substrate 202. The doped region 226 may function as an etch stop layer as will be discussed below. Accordingly, the doped region 226 may have a lower doping concentration as compared to typical LDD regions.

Figure 2C:
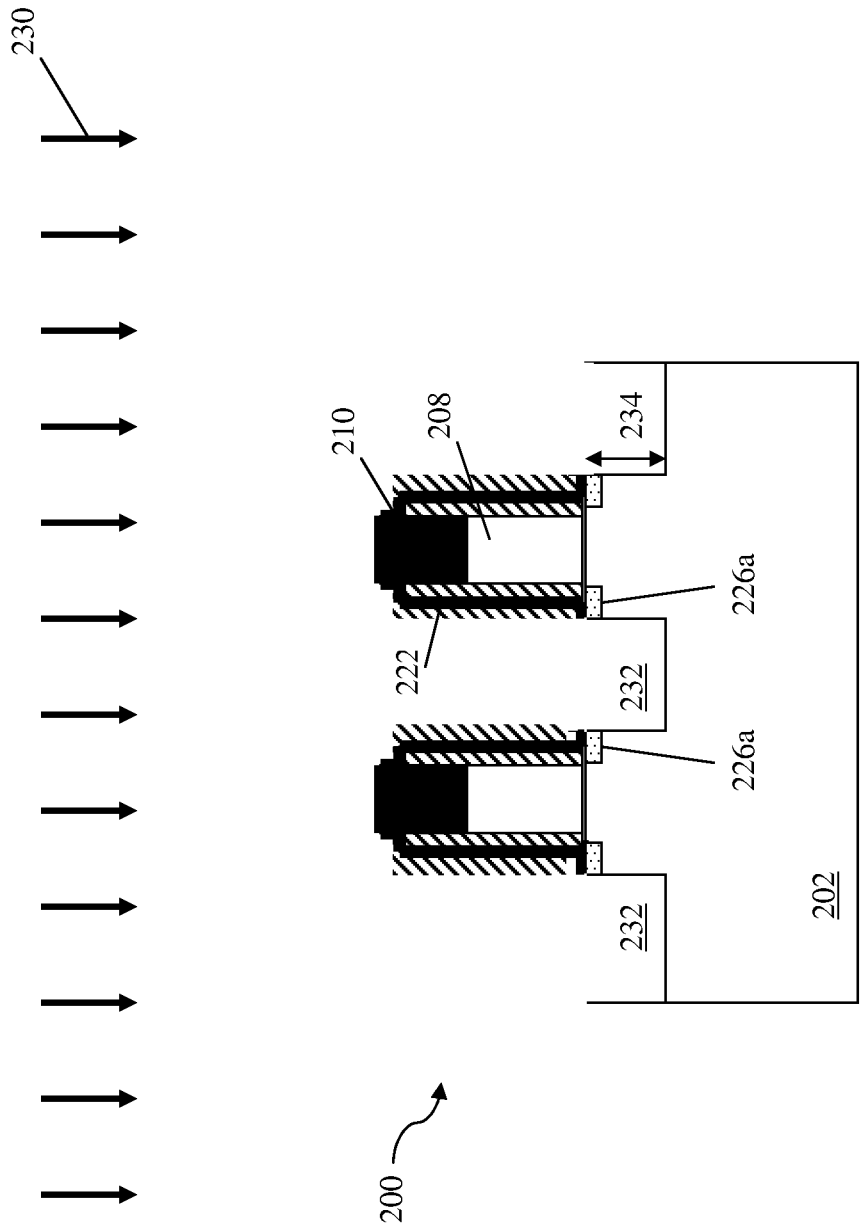

In FIG. 2C, an etching process 230 is performed to etch a recess 232 in the substrate 202. The etching process 230 includes a dry etching process that utilizes a combination of HBr//O2/He, a pressure ranging from about 1 mT to about 1000 mT, a power ranging from about 50 W to about 1000 W, a bias voltage ranging from about 20 V to about 500 V, an HBr flow rate ranging from about 10 sccm to about 500 sccm, an O2 flow rate ranging from about 0 sccm to about 100 sccm, and an He flow rate ranging from about 0 sccm to about 1000 sccm. The dry etching removes portions of the silicon substrate 202 that are unprotected or exposed. The dry etching process allows better control of an etching direction to achieve of a particular shape. Accordingly, the recess 232 is "U" shaped having vertical sidewalls that are aligned with the spacer 222 due to the directional/anisotropic etching. The recess 232 may have a depth 234 ranging from about 400 to about 700 Angstrom (Å). It should be noted that a portion of the doped region 226a remains after the etching process 230. The remaining doped region 226a was protected by the spacer 220 during the etching process 230.

Figure 2D:
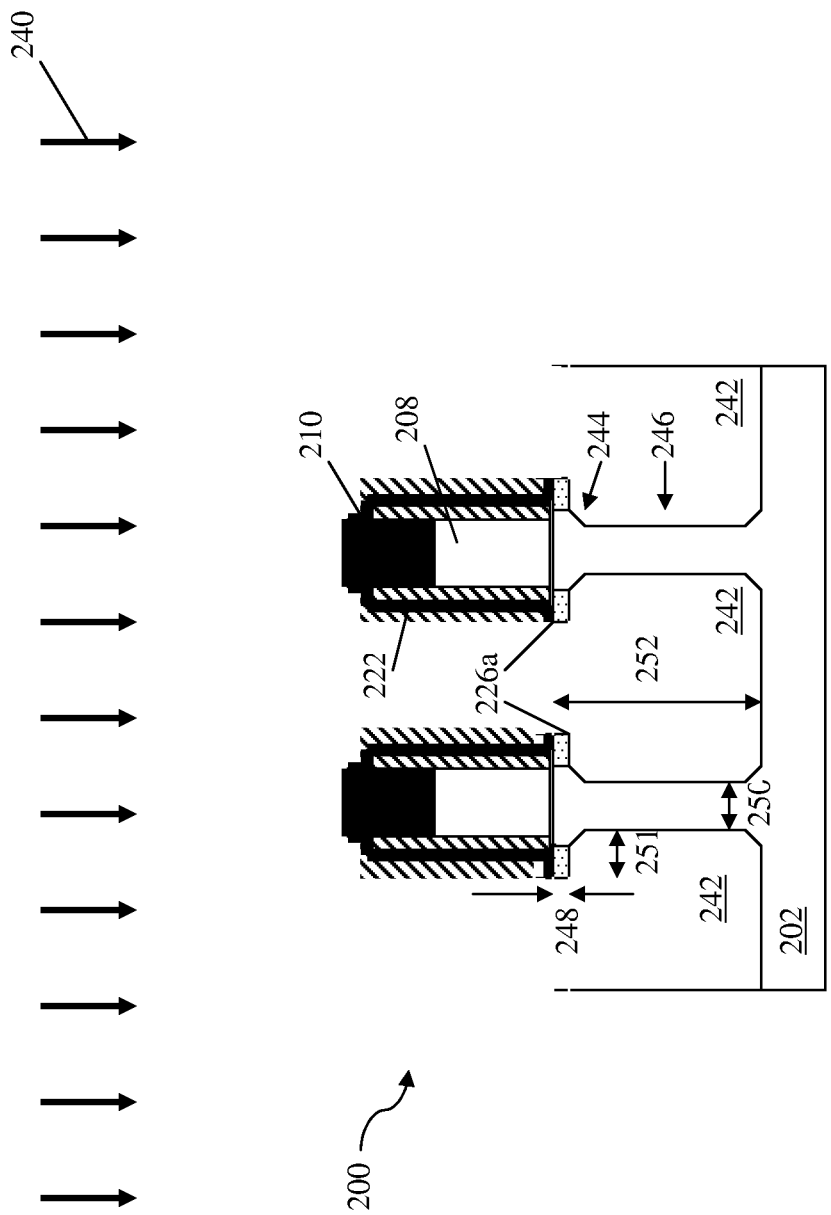

In FIG. 2D, an etching process 240 is performed to modify the recess 232 in the substrate 202. The etching process 240 includes a wet etching process with selectivity modulation. In the present embodiment, the wet etching process utilizes a combination of tetramethylammonium hydroxide (TMAH), isopropyl alcohol (IPA), and H2O. It has been observed that the etching rates on different silicon crystal planes can be varied by modulating a temperature and/or concentration of the wet etching solution, particularly TMAH. For example, TMAH exhibits different etch rates depending on which crystal plane is exposed. Accordingly, the temperature and/or concentration of the wet etching solution can be modulated to achieve desired etching rates for particular silicon crystal planes. For example, TMAH, IPA, and H2O is mixed in a volume ratio of 1:1:8 at room temperature (e.g., about 25° C.). The etching rate is about 6 nm/min at this condition. For a 650 nm deep "U" shaped silicon recess, the wet etch of about 200 seconds will achieve the desired "T" shape. The chemical composition and process temperature may be changed to meet process requirements. Further, the wet silicon etchant TMAH may be replaced with ethylenediamine procatechol (EDP) or alkali-OH.

It should be noted that the remaining doped region 226a functions as an etch stop layer for the wet etching. Thus, the wet etching process with selectivity modulation forms a recess 242 such that the substrate 202 has a "T" shape directly under the gate structure. The "T" shape includes a horizontal portion 244 and a vertical portion 246 that extends from a center region of the horizontal portion 244. The horizontal portion 244 may have a dimension 248 ranging from about 1 nm to about 7 nm. The vertical portion 246 may have a dimension 250 ranging from about 10 nm to about 40 nm depending on the gate length. In some embodiments, the vertical portion 246 is disposed between the sidewalls of the gate structure. That is, the vertical portion 246 is disposed between imaginary lines that extend from the sidewalls of the gate structure, respectively. Additionally, the vertical portion 246 is spaced a distance 251 from an outer edge of the spacer 222, the distance 251 ranging from about 10 nm to about 30 nm depending on the dummy spacer width. Further, the recess 242 includes an overall depth 252 ranging from about 500 to about 1200 Angstrom (Å).

Figure 2E:
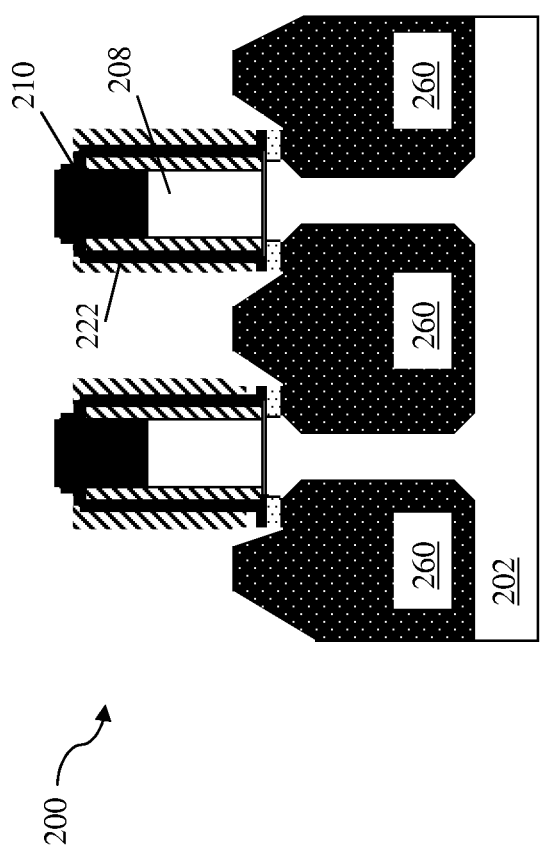

In FIG. 2E, an epitaxy process is performed to deposit a semiconductor material in the recess 242. The semiconductor material is different from the substrate 202. Accordingly, the channel region is strained or stressed to enable carrier mobility of the device and enhance the device performance. A pre-cleaning process may be performed to clean the recess 242 with HF or other suitable solution. In the present embodiment, silicon germanium (SiGe) 260 is deposited by an epitaxy (epi) process on the substrate 202 to form the source and drain regions. It is noted that by increasing the total volume of the recess 242, the total volume of the SiGe 260 structure is also increased. Accordingly, more stress and strain can be exerted on the channel region of the substrate which may further enhances device performance. Additionally, the SiGe 260 is deposited such that it is raised a distance ranging from about 125 Angstrom to about 250 Angstrom above the surface of the substrate 202. In furtherance of the present embodiment, the SiGe 260 may be in-situ doped with p-type impurities, such as B or In, to form source/drain regions of the PMOS devices.

The semiconductor device 200 continues with processing to complete fabrication as discussed briefly below. In some embodiments, the spacers 222 remain on the sidewalls of the gate structure and processing continues forming silicide features on the raised source/drain regions to reduce the contact resistance. The silicide can be formed on the sources/drains regions by a process including depositing a metal layer, annealing the metal layer such that the metal layer is able to react with silicon to form silicide, and then removing the non-reacted metal layer. In some other embodiments, the spacers 222 may function as dummy spacers and may be removed, and processing continues with forming lightly doped source/drain (LDD) regions and heavily doped source/drain regions in the SiGe 260 structure.

An inter-level dielectric (ILD) layer is formed on the substrate and a chemical mechanical polishing (CMP) process is further applied to the substrate to polish the substrate. In another example, an contact etch stop layer (CESL) is formed on top of the gate structures before forming the ILD layer. In an embodiment, the gate electrode 208 remains poly in the final device. In another embodiment, the poly is removed and replaced with a metal in a gate last or gate replacement process. In a gate last process, the CMP process on the ILD layer is continued until the poly surface is exposed, and an etching process is performed to remove the poly thereby forming trenches. The trenches are filled with a proper work function metal (e.g., p-type work function metal and n-type work function metal) in the PMOS devices and the NMOS device. A multilayer interconnection (MLI) is formed on the substrate to electrically connect various device features to form a integrated circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

Figure 3:
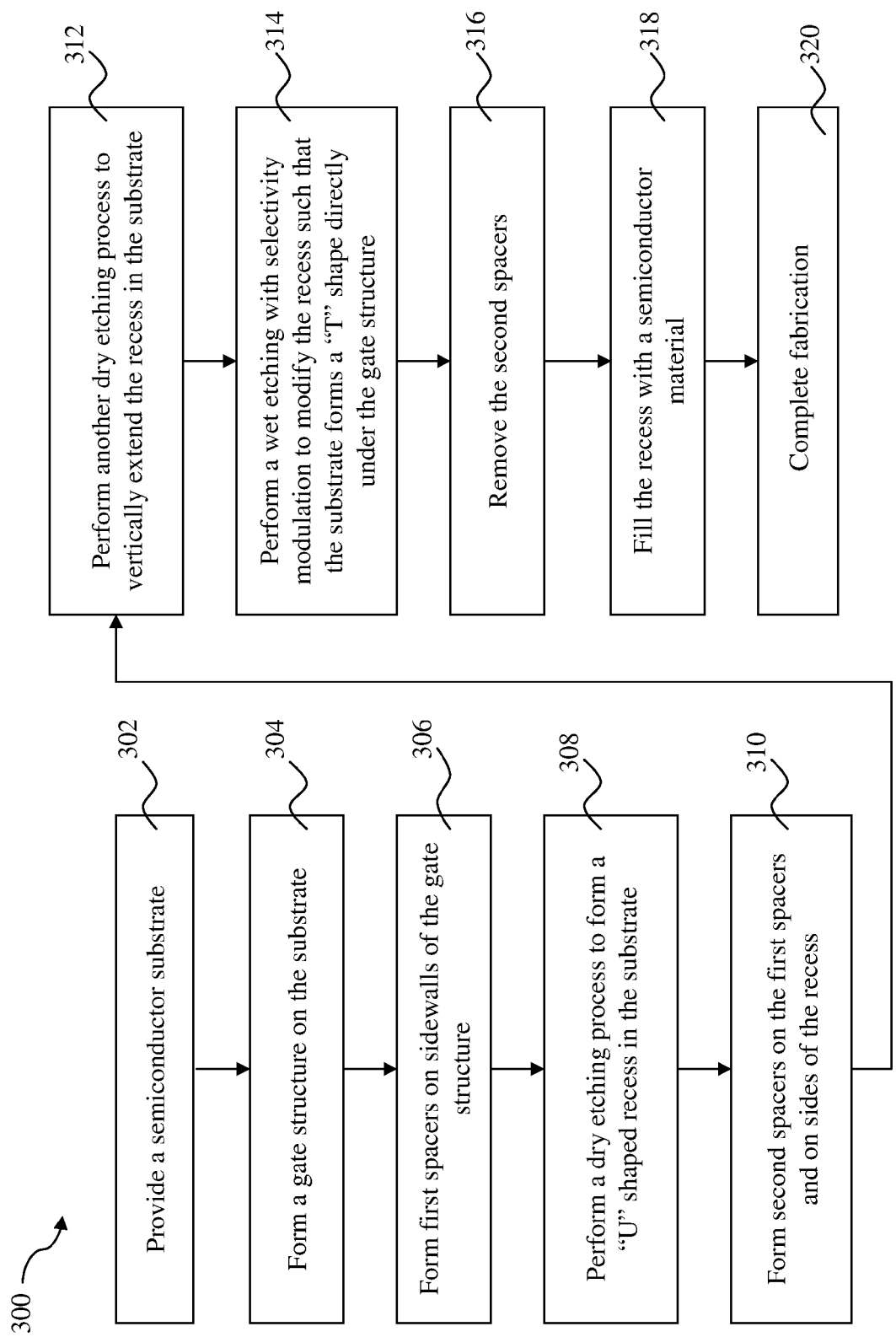
FIG. 3 is a flow chart of another method of fabricating a semiconductor device having strained features according to various aspects of the present disclosure.

Referring to FIG. 3, illustrated is a flow chart of a method 300 of fabricating a semiconductor device according to various aspects of the present disclosure. The method 300 begins with block 302 in which a semiconductor substrate is provided. The method 300 continues with block 304 in which a gate structure is formed on the substrate. The method 300 continues with block 306 in which first spacers are formed on sidewalls of the gate structure. The method continues with block 308 in which a dry etching process is performed to form a "U" shaped recess in the substrate. The method 300 continues with block 310 in which second spacers are formed on the first spacers and on sides of the recess. The method 300 continues with block 312 in which another dry etching process is performed to vertically extend the recess in the substrate. The method 300 continues with block 314 in which a wet etching process with selectivity modulation is performed to modify the recess such that the substrate forms a "T" shape directly under the gate structure. The method 300 continues with block 316 in which the second spacers are removed. The method 300 continues with block 318 in which the recess is filled with a semiconductor material. The method 300 continues with block 320 in which fabrication of the semiconductor device is completed. The discussion that follows illustrates various embodiments of a semiconductor device that can be fabricated according to the method 300 of FIG. 3.

Figure 4A:
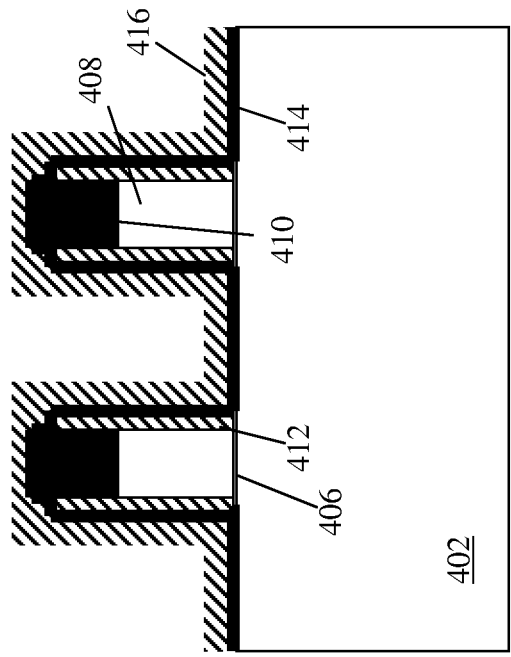
FIGS. 4A-4G are cross-sectional views of another embodiment of a semiconductor device at various stages of fabrication according to the method of FIG. 3.

Referring to FIGS. 4A-4G, illustrated is an embodiment of a semiconductor device 400 at various stages of fabrication according to the method 300 of FIG. 3. It is understood that FIGS. 4A-4G have been simplified for the sake of clarity to better understand the inventive concepts of the present disclosure. In FIG. 4A, the semiconductor device 400 includes a substrate 402 similar to the substrate 202 of FIG. 2.

Various shallow trench isolation (STI) structures are formed in the semiconductor substrate for isolating the various active regions. One or more operational devices are formed in the active regions. The operational devices include n-type and p-type metal-oxide-semiconductor field-effect transistors (NMOS and PMOS). The operational devices are configured as an array of NMOS devices and an array of PMOS devices. Each NMOS and PMOS device includes a gate structure formed on the semiconductor substrate 402. In the present embodiment, only PMOS devices are illustrated for the sake of clarity. It is understood that the NMOS devices in other regions of the substrate 402 may be protected by a photoresist or other suitable protection layer during formation of the strained features in the PMOS devices.

The gate structure includes a gate dielectric 406 and a gate electrode. The gate dielectric 406 may include silicon oxide, silicon nitride, high-k dielectric, or other suitable material. The gate electrode 408 may include polysilicon (or poly). For example, silane (SiH4) may be used as a chemical gas in a CVD process to form the poly. The poly layer may include a thickness ranging from about 400 to about 800 Angstrom (Å). Alternatively, the gate electrode 408 layer may include a metal such as Al, Cu, W, Ti, Ta, TiN, TaN, NiSi, CoSi, other suitable conductive materials, or combinations thereof. The gate structure may further include a hard mask layer 410 formed on the gate electrode 408. The hard mask layer 410 include silicon oxide. Alternatively, the hard mask layer 410 may optionally silicon nitride, silicon oxynitride, and/or other suitable dielectric materials, and may be formed using a method such as CVD or PVD. The hard mask layer 410 may include a thickness ranging from about 100 to about 800 Angstrom (Å).

The semiconductor device 400 includes a sealing layer 412 formed on each sidewall of the gate structures. The sealing layer 412 includes silicon nitride and has a thickness ranging from about 4 to about 6 nm. The sealing layer 412 may be formed by CVD, PVD, ALD, plasma enhanced CVD (PECVD), or other suitable technique. The sealing layer 412 may function to protect the gate structure during subsequent processing.

The semiconductor device 400 further includes an oxide layer 414 formed over the substrate 402 and the gate structures. The oxide layer 414 may be formed by CVD, PVD, ALD, or other suitable technique. The oxide layer 414 includes a thickness ranging from about 2 to about 4 nm. The semiconductor device 400 further includes a nitride layer 416 formed over the oxide layer 414. The nitride layer 416 may be formed by CVD, PVD, ALD, or other suitable technique. The nitride layer 416 includes a thickness ranging from about 10 to about 15 nm.

Figure 4B:
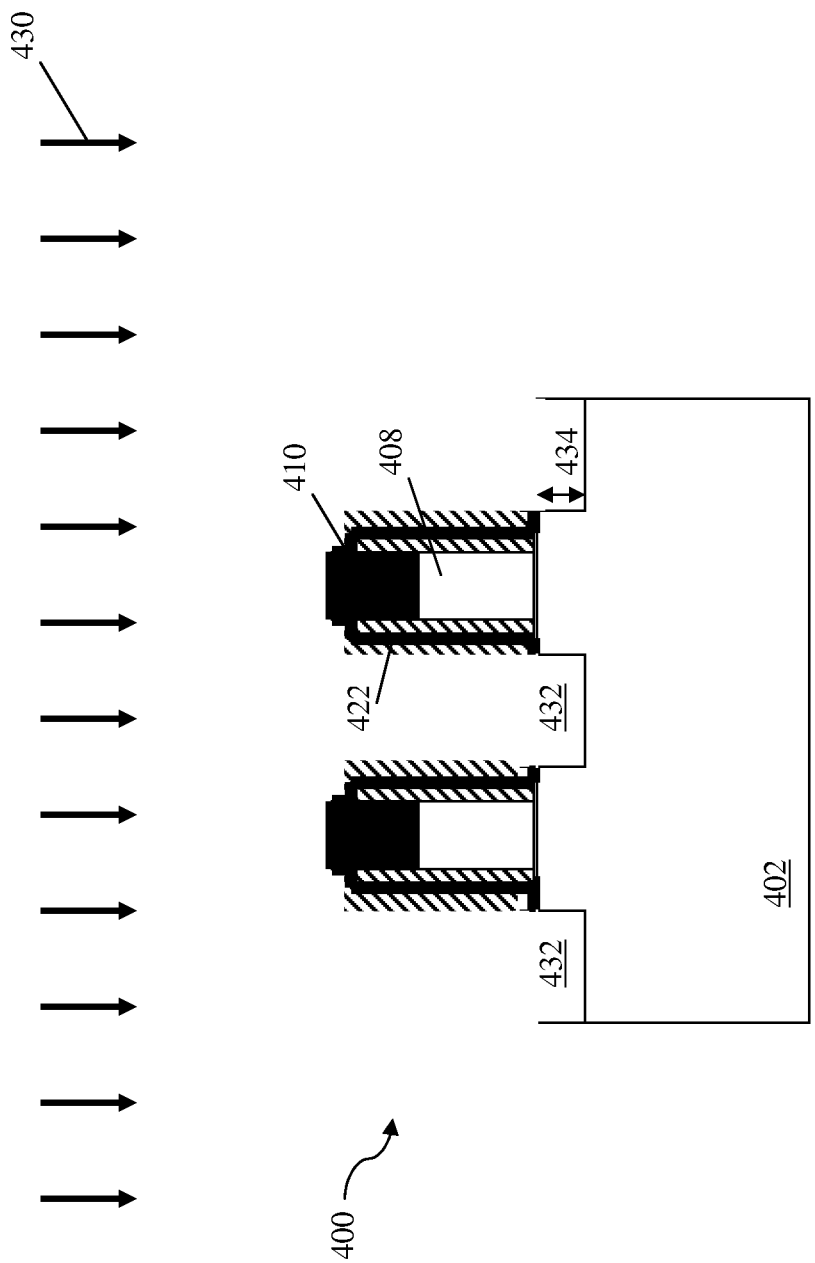

In FIG. 4B, an etching process is performed to form spacers on sidewalls of the gate structure of the PMOS devices. In the present embodiment, a dry etching (e.g., anisotropic etching) is performed on the oxide layer 414 and the nitride layer 416 to form the spacers 422. The spacers 422 have a thickness ranging from about 5 to about 30 nm. Alternatively, the spacers 422 may be formed of other dielectric materials such as silicon oxynitride and silicon carbon nitride.

An etching process 430 is performed to etch a recess 432 in the substrate 402. The etching process 430 includes a dry etching process that utilizes a combination of HBr//O2/He, a pressure ranging from about 1 mT to about 1000 mT, a power ranging from about 50 W to about 1000 W, a bias voltage ranging from about 20 V to about 500 V, an HBr flow rate ranging from about 10 sccm to about 500 sccm, an O2 flow rate ranging from about 0 sccm to about 100 sccm, and an He flow rate ranging from about 0 sccm to about 1000 sccm. The dry etching removes portions of the silicon substrate 402 that are unprotected or exposed. The dry etching process allows better control of an etching direction to achieve of a particular shape. Accordingly, the recess 432 is "U" shaped having vertical sidewalls that are aligned with the spacer 422 due to the directional/anisotropic etching. The recess 432 may have a depth 434 ranging from about 400 to about 700 Angstrom (Å).

Figure 4C:
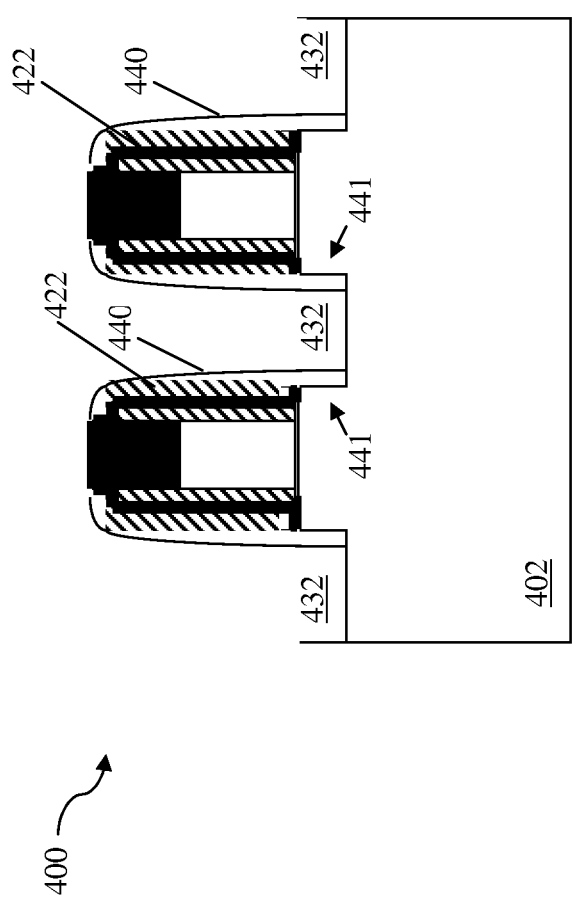

In FIG. 4C, dummy spacers 440 are formed on the spacers 422 and on the sidewalls of the recess 432. The dummy spacers 440 may be formed by forming a dielectric layer over the substrate 402 and the gate electrode, and performing a dry etching (e.g., anisotropic etching) to form the spacers 440. The dummy pacers 440 may include silicon nitride or other suitable material. The dummy spacers 440 have a thickness ranging from about 5 nm to about 30 nm. It should be noted that a portion 441 of the dummy spacers 440 will help protect a LDD region from being removed during a subsequent etching as will be discussed below. Alternatively, a nitridation process may be performed on the exposed substrate 402 within the recess 432 thereby forming a silicon nitride layer at the surface of the recess 432 including the sidewalls. As such, the silicon nitride layer on the sidewalls of the recess 432 may serve a similar purpose as the dummy spacers 440 and may be removed prior to depositing silicon germanium.

Figure 4D:
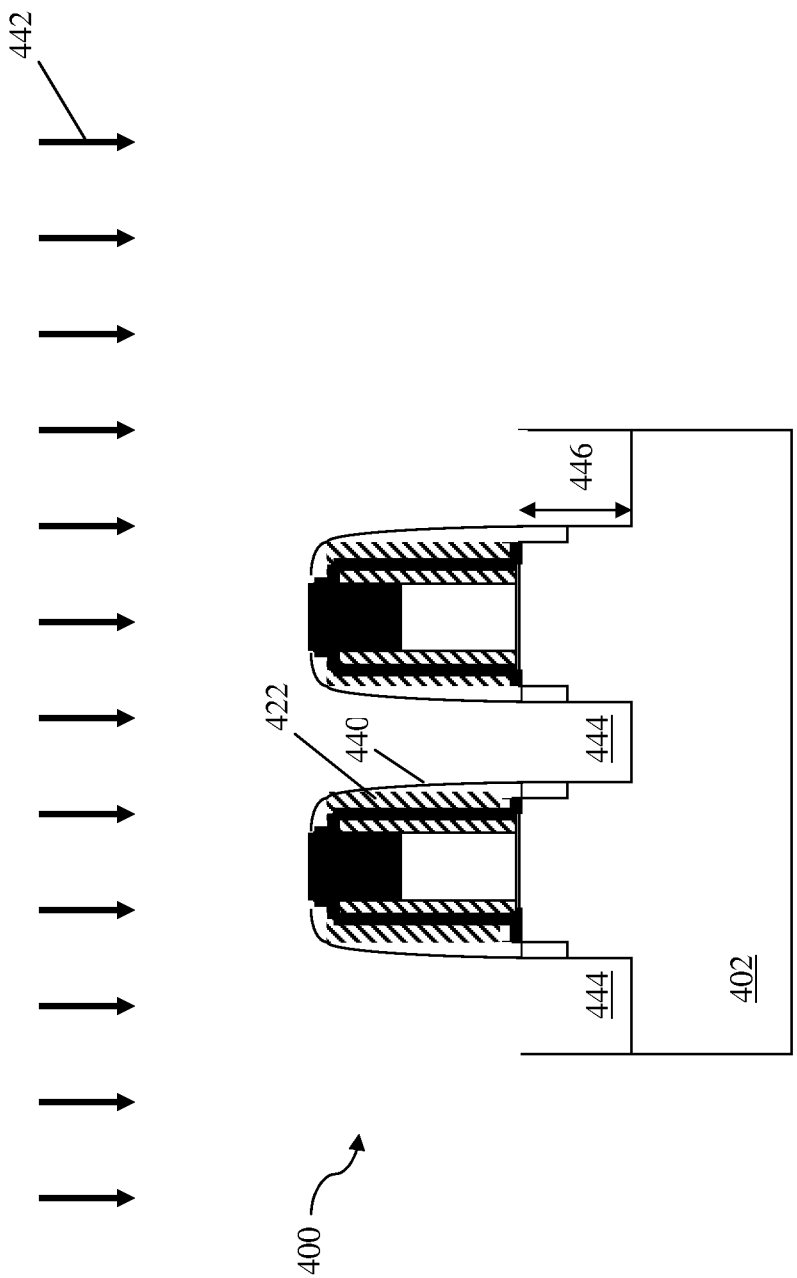

In FIG. 4D, an etching process 442 is performed to vertically extend the recess 432 in the substrate 402. The etching process 442 includes a dry etching process that utilizes a combination of HBr//O2/He, a pressure ranging from about 1 mT to about 1000 mT, a power ranging from about 50 W to about 1000 W, a bias voltage ranging from about 20 V to about 500 V, an HBr flow rate ranging from about 10 sccm to about 500 sccm, an O2 flow rate ranging from about 0 sccm to about 100 sccm, and an He flow rate ranging from about 0 sccm to about 1000 sccm. The dry etching removes portions of the silicon substrate 402 that are exposed. Accordingly, the recess 432 is vertically extended in the substrate 402 to form a recess 444 with sidewalls that are aligned with the dummy spacer 440 due to the directional/anisotropic etching. The recess 444 may have a depth 446 ranging from about 400 to about 700 Angstrom (Å).

Figure 4E:
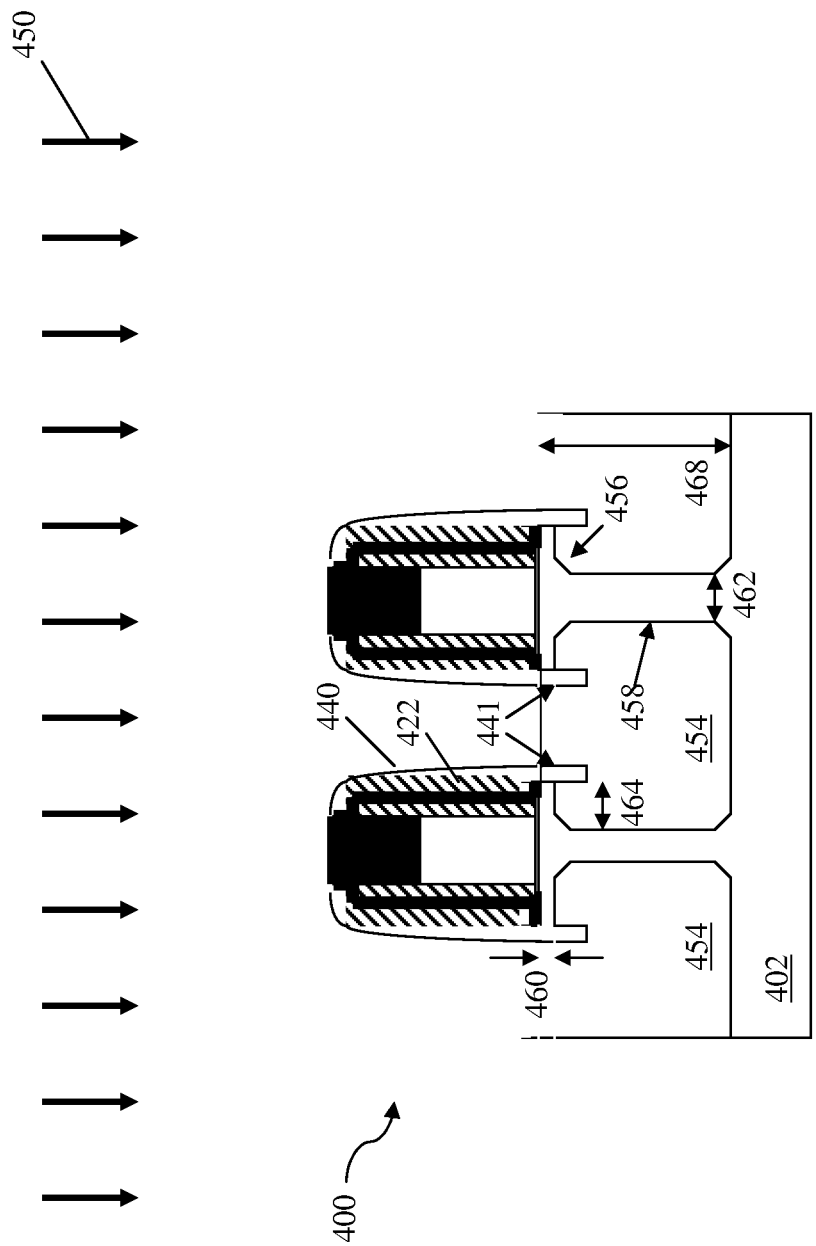

In FIG. 4E, an etching process 450 is performed to modify the recess 444 in the substrate 402. The etching process 450 includes a wet etching process with selectivity modulation. In the present embodiment, the wet etching process utilizes a combination of tetramethylammonium hydroxide (TMAH), isopropyl alcohol (IPA), and H2O. It has been observed that the etching rates on different silicon crystal planes can be varied by modulating a temperature and/or concentration of the wet etching solution, particularly TMAH. For example, TMAH exhibits different etch rates depending on which crystal plane is exposed. Accordingly, the temperature and/or concentration of the wet etching solution can be modulated to achieve desired etching rates for particular silicon crystal planes. For example, TMAH, IPA, and H2O is mixed in a volume ratio of 1:1:8 at room temperature (e.g., about 25° C.). The etching rate is about 6 nm/min at this condition. For a 650 nm deep "U" shaped silicon recess, the wet etch of about 200 seconds will achieve the desired "T" shape. The chemical composition and process temperature may be changed to meet process requirements. Further, the wet silicon etchant TMAH may be replaced with ethylenediamine procatechol (EDP) or alkali-OH.

It should be noted that the portion 441 of the dummy spacers 440 helps prevent removal of the silicon substrate at the LDD region during the wet etching. Thus, the wet etching process with selectivity modulation forms a recess 454 such that the substrate 402 has a "T" shape directly under the gate structure. The "T" shape includes a horizontal portion 456 and a vertical portion 458 that extends from a center region of the horizontal portion 456. The horizontal portion 456 may have a dimension 460 ranging from about 1 nm to about 7 nm The vertical portion 458 may have a dimension 462 ranging from about 10 nm to about 40 nm depending on the gate length. Additionally, the vertical portion 458 is spaced a distance 464 from an outer edge of the spacer 422, the distance 464 ranging from about 10 nm to about 30 nm depending on the dummy spacer width. Further, the recess 454 includes an overall depth 468 ranging from about 500 to about 1200 Angstrom (Å).

Figure 4F:
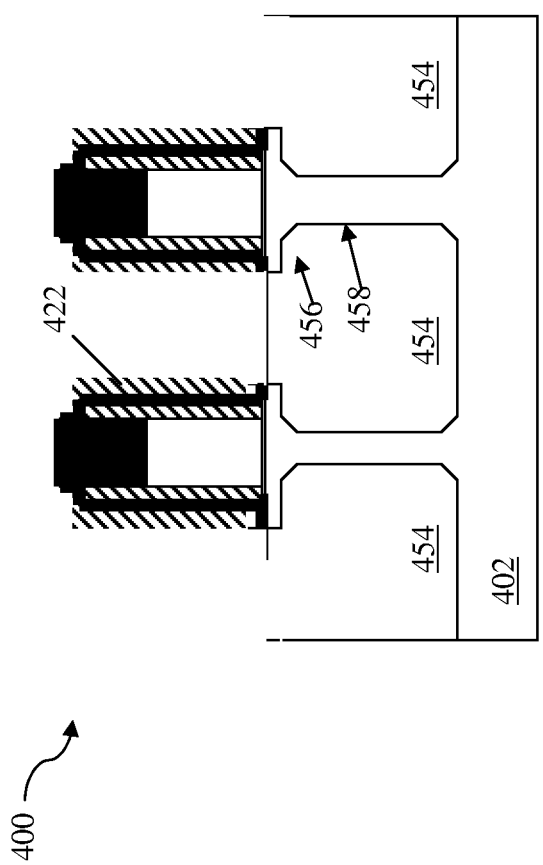

In FIG. 4F, the dummy spacers 440 are removed by an etching process. The etching process may include a wet SPM dip (mixture of H2SO4, H2O2, and H2O), BOE (buffer oxide etching, NH4F+HF+H2O) or HF vapor etching.

Figure 4G:
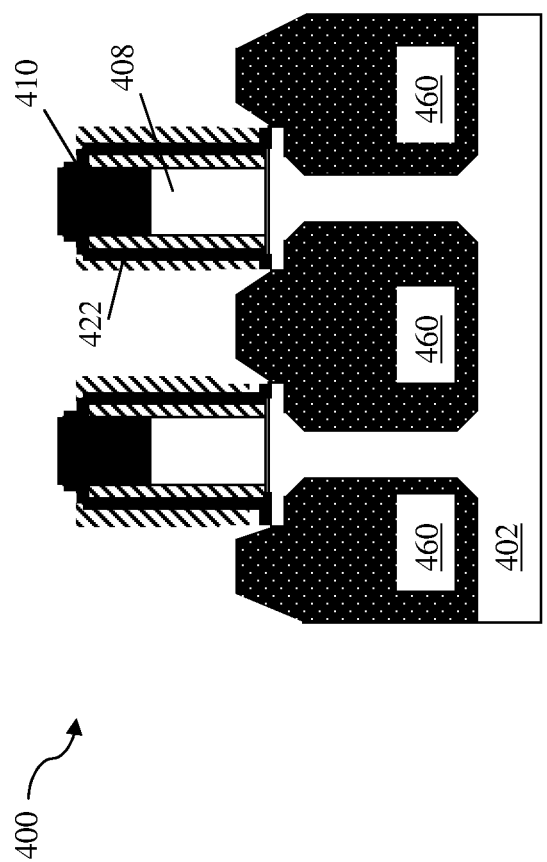

In FIG. 4G, an epitaxy process is performed to deposit a semiconductor material in the recess 454. The semiconductor material is different from the substrate. Accordingly, the channel region is strained or stressed to enable carrier mobility of the device and enhance the device performance. A pre-cleaning process may be performed to clean the recess 454 with HF or other suitable solution. In the present embodiment, silicon germanium (SiGe) 460 is deposited by an epitaxy (epi) process on exposed surfaces of the substrate 402 to form the source and drain regions. It is noted that by increasing the total volume of the recess 454, the total volume of the SiGe 460 structure is also increased. Accordingly, more stress and strain can be exerted on the channel region of the substrate which may further enhances device performance. Additionally, the SiGe 460 is deposited such that it is raised a distance ranging from about 125 Angstrom to about 250 Angstrom above the surface of the substrate 402. In furtherance of the present embodiment, the SiGe 460 may be in-situ doped with p-type impurities, such as B or In, to form source/drain regions of the PMOS devices.

The semiconductor device 400 may undergo further processing to complete fabrication of the NMOS and PMOS device. For example, the semiconductor device 400 continues with processing to complete fabrication similar to the discussion above with reference to the semiconductor device 200 of FIG. 2.

Figure 5:
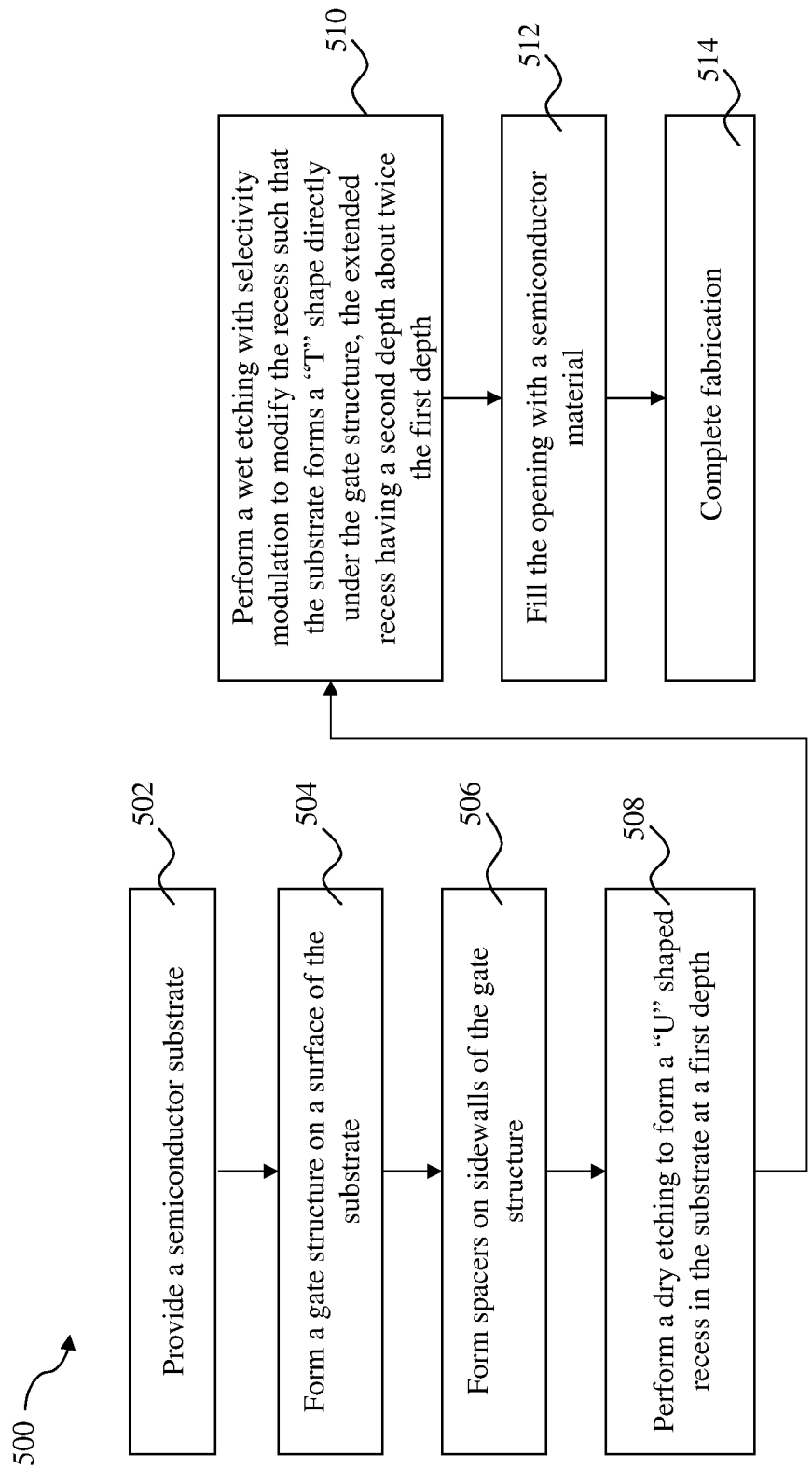
FIG. 5 is a flow chart of still another method of fabricating a semiconductor device having strained features according to various aspects of the present disclosure.

Referring to FIG. 5, illustrated is a flow chart of a method 500 of fabricating a semiconductor device according to various aspects of the present disclosure. The method 500 begins with block 502 in which a semiconductor substrate is provided. The method 500 continues with block 504 in which a gate structure is formed on a surface of the substrate. The method 500 continues with block 506 in which spacers are formed on sidewalls of the gate structure. The method continues with block 508 in which a dry etching process is performed to form a "U" shaped recess in the substrate at a first depth. The method 500 continues with block 510 in which a wet etching process with selectivity modulation is performed to extend the recess such that the substrate forms a "T" shape directly under the gate structure. The extended recess has a second depth that is about twice the first depth. The method 500 continues with block 512 in which the recess is filled with a semiconductor material. The method 500 continues with block 514 in which fabrication of the semiconductor device is completed. The discussion that follows illustrates various embodiments of a semiconductor device that can be fabricated according to the method 500 of FIG. 5.

Figure 6A:
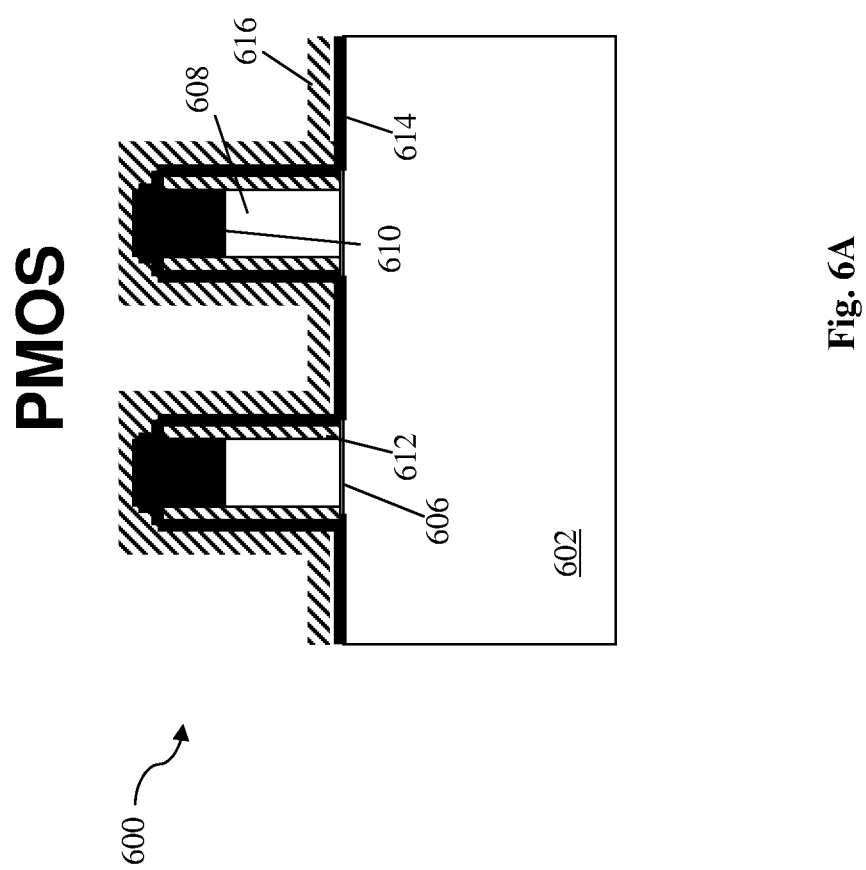
FIGS. 6A-6E are cross-sectional views of another embodiment of a semiconductor device at various stages of fabrication according to the method of FIG. 5.

Referring to FIGS. 6A-6E, illustrated is an embodiment of a semiconductor device 600 at various stages of fabrication according to the method 500 of FIG. 5. It is understood that FIGS. 6A-6E have been simplified for the sake of clarity to better understand the inventive concepts of the present disclosure. In FIG. 6A, the semiconductor device 600 includes a substrate 602 similar to the substrate 202 of FIG. 2.

Various shallow trench isolation (STI) structures 604 are formed in the semiconductor substrate for isolating the various active regions. One or more operational devices are formed in the active regions. The operational devices include n-type and p-type metal-oxide-semiconductor field-effect transistors (NMOS and PMOS). The operational devices are configured as an array of NMOS devices and an array of PMOS devices. Each NMOS and PMOS device includes a gate structure formed on the semiconductor substrate 602. The gate structure includes a gate dielectric 606 and a gate electrode. In the present embodiment, only PMOS devices are illustrated for the sake of clarity. It is understood that the NMOS devices in other regions of the substrate 602 may be protected by a photoresist or other suitable protection layer during formation of the strained features in the PMOS devices.

The gate dielectric 606 may include silicon oxide, silicon nitride, high-k dielectric, or other suitable material. The gate electrode 608 may include polysilicon (or poly). For example, silane (SiH4) may be used as a chemical gas in a CVD process to form the poly. The poly layer may include a thickness ranging from about 400 to about 800 Angstrom (Å). Alternatively, the gate electrode 608 layer may include a metal such as Al, Cu, W, Ti, Ta, TiN, TaN, NiSi, CoSi, other suitable conductive materials, or combinations thereof. The gate structure may further include a hard mask layer 610 formed on the gate electrode 608. The hard mask layer 610 include silicon oxide. Alternatively, the hard mask layer 610 may optionally silicon nitride, silicon oxynitride, and/or other suitable dielectric materials, and may be formed using a method such as CVD or PVD. The hard mask layer 610 may include a thickness ranging from about 100 to about 800 Angstrom (Å).

The semiconductor device 600 includes a sealing layer 612 formed on each sidewall of the gate structures. The sealing layer 612 includes silicon nitride and has a thickness ranging from about 4 to about 6 nm. The sealing layer 612 may be formed by CVD, PVD, ALD, plasma enhanced CVD (PECVD), or other suitable technique. The sealing layer 612 may function to protect the gate structure during subsequent processing.

The semiconductor device 600 further includes an oxide layer 614 formed over the substrate 602 and the gate structures. The oxide layer 614 may be formed by CVD, PVD, ALD, or other suitable technique. The oxide layer 614 includes a thickness ranging from about 2 to about 4 nm. The semiconductor device 600 further includes a nitride layer 616 formed over the oxide layer 614. The nitride layer 616 may be formed by CVD, PVD, ALD, or other suitable technique. The nitride layer 616 includes a thickness ranging from about 10 to about 15 nm.

Figure 6B:
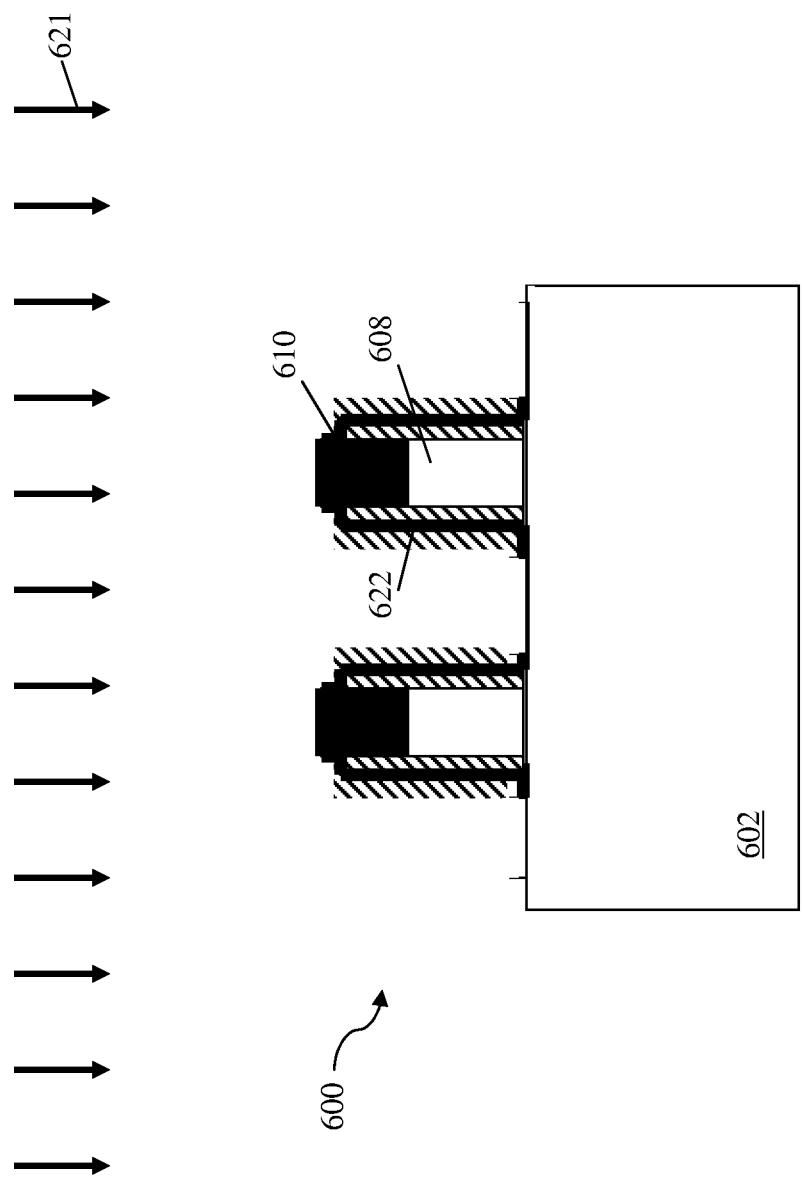

In FIG. 6B, an etching process 621 is performed to form spacers on sidewalls of the gate structure of the PMOS devices. In the present embodiment, a dry etching (e.g., anisotropic etching) is performed on the oxide layer 614 and the nitride layer 616 to form the spacers 622. The spacers 622 have a thickness ranging from about 8 to about 30 nm. Alternatively, the spacers 622 may be formed of other dielectric materials such as silicon oxynitride and silicon carbon nitride.

Figure 6C:
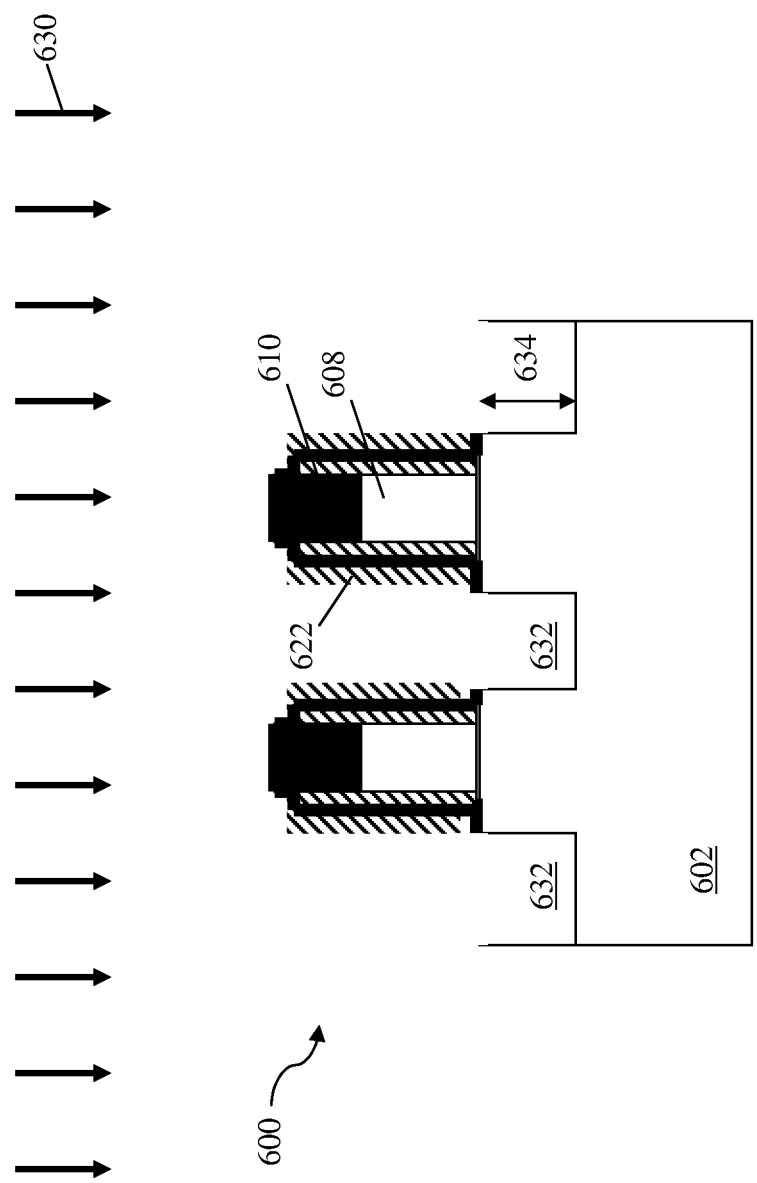

In FIG. 6C, an etching process 630 is performed to etch a recess 632 in the substrate 602. The etching process 630 includes a dry etching process that utilizes a combination of HBr//O2/He, a pressure ranging from about 1 mT to about 1000 mT, a power ranging from about 50 W to about 1000 W, a bias voltage ranging from about 20 V to about 500 V, an HBr flow rate ranging from about 10 sccm to about 500 sccm, an O2 flow rate ranging from about 0 sccm to about 100 sccm, and an He flow rate ranging from about 0 sccm to about 1000 sccm. The dry etching removes portions of the silicon substrate 402 that are unprotected or exposed. The dry etching process allows better control of an etching direction to achieve of a particular shape. Accordingly, the recess 632 is "U" shaped having vertical sidewalls that are aligned with the spacer 622 due to the directional/anisotropic etching. The recess 632 may have a depth 634 ranging from about 400 to about 700 Angstrom (Å).

Figure 6D:
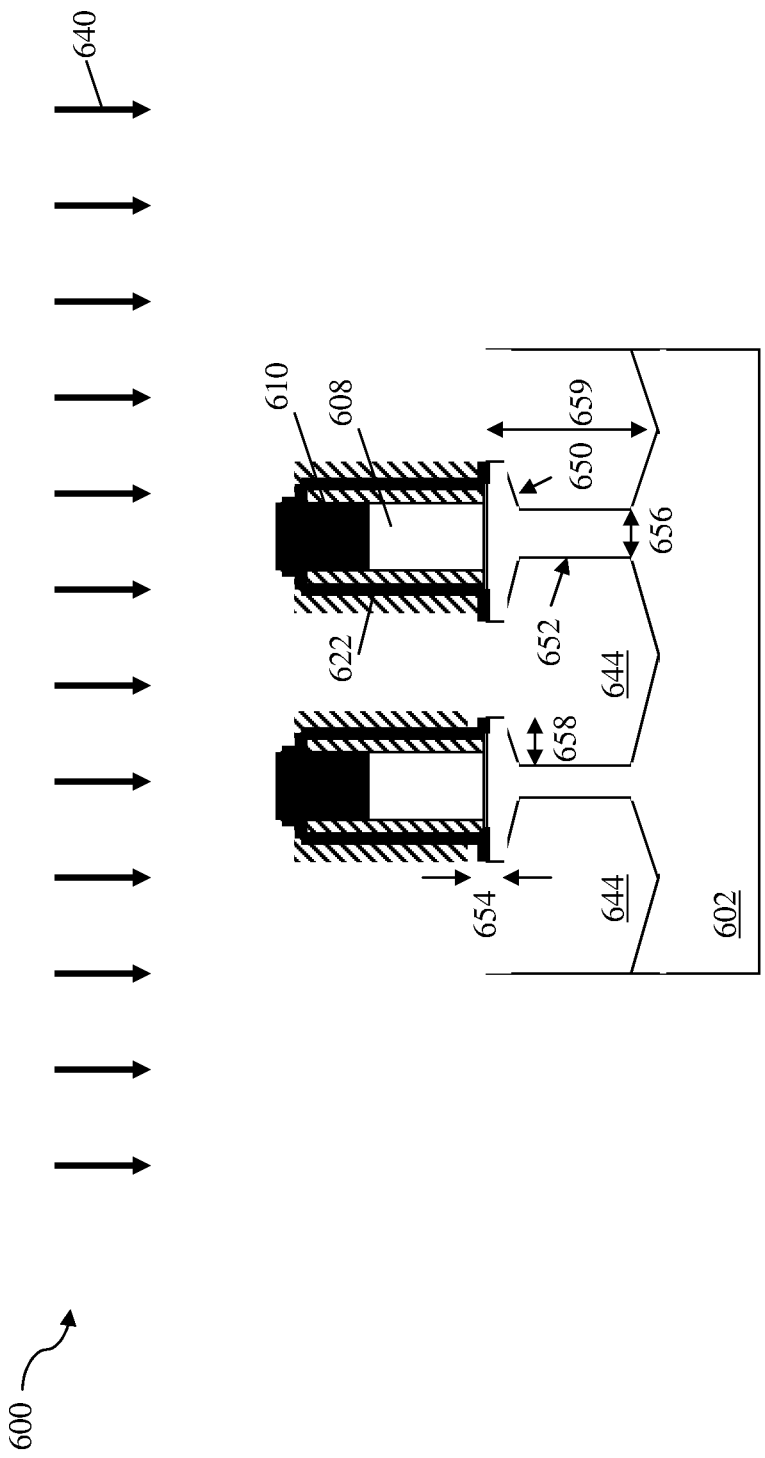

In FIG. 6D, an etching process 640 is performed to extend the recess 634 in the substrate 602. The etching process 640 includes a wet etching process with selectivity modulation. In the present embodiment, the wet etching process utilizes a combination of tetramethylammonium hydroxide (TMAH), isopropyl alcohol (IPA), and H2O. It has been observed that the etching rates on different silicon crystal planes can be varied by modulating a temperature and/or concentration of the wet etching solution, particularly TMAH. For example, TMAH exhibits different etch rates depending on which crystal plane is exposed. Accordingly, the temperature and/or concentration of the wet etching solution can be modulated to achieve desired etching rates for particular silicon crystal planes. For example, TMAH, IPA, and H2O is mixed in a volume ratio of 1:1:8 at room temperature (e.g., about 25° C.). The etching rate is about 6 nm/min at this condition. For a 650 nm deep "U" shaped silicon recess, the wet etch of about 200 seconds will achieve the desired "T" shape. The chemical composition and process temperature may be changed to meet process requirements. Further, the wet silicon etchant TMAH may be replaced with ethylenediamine procatechol (EDP) or alkali-OH.

It should be noted that the present embodiment does not employ a doped region for an etch stop as was discussed in the embodiment of FIG. 2 or an additional spacer to prevent removal at the LDD region as was discussed in the embodiment of FIG. 4. As such, the resulting profile of the wet etching is controlled by tuning the temperature and/or concentration of the TMAH and IPA of the wet solution. Thus, the wet etching process with selectivity modulation forms a recess 644 such that the substrate 602 has a "T" shape directly under the gate structure. The "T" shape includes a horizontal portion 650 and a vertical portion 652 that extends from a center region of the horizontal portion 650. The horizontal portion 650 may have a dimension 654 ranging from about 1 nm to about 7 nm. The vertical portion 652 may have a dimension 656 ranging from about 10 nm to about 40 nm depending on the gate length. Additionally, the vertical portion 652 is spaced a distance 658 from an outer edge of the spacer 622, the distance 658 ranging from about 10 nm to about 30 nm depending on the dummy spacer width. Further, the recess 644 includes an overall depth 659 ranging from about 500 to about 1200 Angstrom (Å).

Figure 6E:
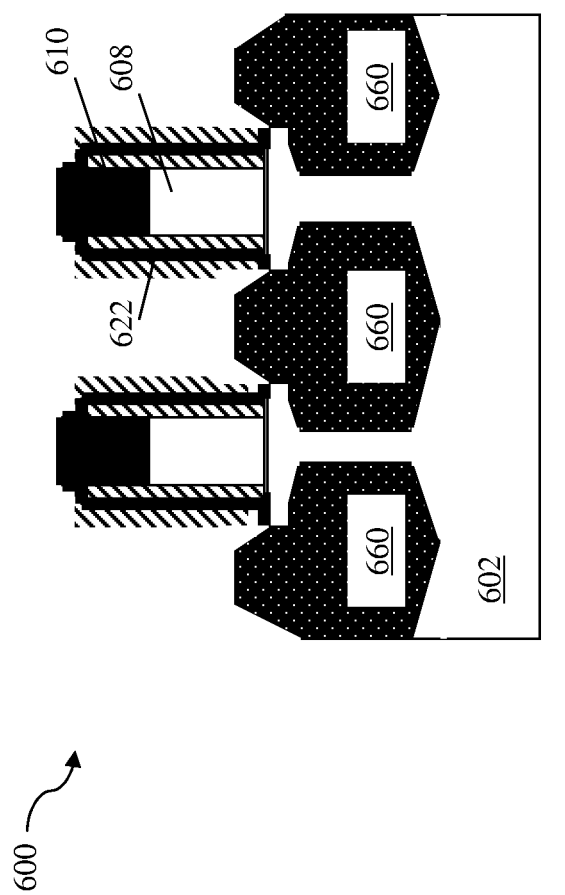

In FIG. 6E, an epitaxy process is performed to deposit a semiconductor material in the recess 644. The semiconductor material is different from the substrate. Accordingly, the channel region is strained or stressed to enable carrier mobility of the device and enhance the device performance. A pre-cleaning process may be performed to clean the recess 644 with HF or other suitable solution. In the present embodiment, silicon germanium (SiGe) 660 is deposited by an epitaxy (epi) process on exposed surfaces of the substrate 602 to form the source and drain regions. It is noted that by increasing the total volume of the recess 644 (e.g., "T" shaped substrate directly under the gate structure), the total volume of the SiGe 660 structure is also increased. Accordingly, more stress and strain can be exerted on the channel region of the substrate which may further enhances device performance. Additionally, the SiGe 660 is deposited such that it is raised a distance ranging from about 125 Angstrom to about 250 Angstrom above the surface of the substrate 602. In furtherance of the present embodiment, the SiGe 660 may be in-situ doped with p-type impurities, such as B or In, to form source/drain regions of the PMOS devices.

The semiconductor device 600 may undergo further processing to complete fabrication of the NMOS and PMOS device. For example, the semiconductor device 600 continues with processing to complete fabrication similar to the discussion above with reference to the semiconductor device 200 of FIG. 2.

The semiconductor devices 200, 400, and 600 serve only as examples. The semiconductor devices 200, 400, and 600 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a semiconductor device, comprising:
   providing a semiconductor substrate;
   forming a gate structure on a surface of the substrate, the gate structure including a first spacer disposed on a sidewall of the gate structure;
   performing a dry etching to form a recess in the substrate, wherein the recess is U shaped having a side aligned with the first spacer;
   thereafter forming a second spacer over and on the first spacer disposed on the side wall of the gate structure and on a sidewall of the recess;
   performing a wet etching with selectivity modulation to modify the recess such that the gate structure is disposed on a portion of the substrate, wherein the portion of the substrate is T shaped having a horizontal region and a vertical region that extends from the horizontal region in a direction away from the surface of the substrate; and
   filling the recess with a semiconductor material different from the semiconductor substrate.

2. The method of claim 1, further comprising:
   performing another dry etching to vertically extend the recess, wherein the extended recess has a side aligned with the second spacer; and
   after performing the wet etching, removing the second spacer.

3. The method of claim 1, wherein the wet etching with selectivity modulation utilizes a wet solution of tetramethylammonium hydroxide (TMAH), isopropyl alcohol (IPA), and H2O.

4. The method of claim 3, wherein the TMAH, IPA, and H2O has a volume ratio of 1:1:8 and the wet solution is at room temperature.

5. The method of claim 1, wherein the filling the recess with the semiconductor material includes depositing silicon germanium (SiGe) by an epitaxy process.

6. The method of claim 1, wherein thereafter forming the second spacer on the first spacer disposed on the side wall of the gate structure and on the sidewall of the recess includes forming the second spacer directly on and in contact with the first spacer disposed on the side wall of the gate structure.

7. A method comprising:
providing a semiconductor substrate having an upper surface;
forming a gate structure on the upper surface of the substrate;
forming a spacer on a sidewall of the gate structure;
performing an implantation process on the substrate to form a doped region in the substrate after forming the spacer on the sidewall of the gate structure;
performing a first etching to form a recess in the substrate;
performing a second etching to modify the recess such that the gate structure is disposed on a portion of the substrate, wherein the portion of the substrate is T shaped having a horizontal region and a vertical region that extends from the horizontal region in a direction away from the upper surface of the substrate, wherein a bottommost surface of the recess is free of an etch stop layer during the entire step of performing the second etching to modify the recess, the bottommost surface being positioned further away from the upper surface of the substrate than any other surface of the recess; and
filling the modified recess with a semiconductor material different from the semiconductor substrate.

8. The method of claim 7, wherein the recess is U shaped having a side substantially coplanar with an outer edge of the spacer, wherein the outer edge of the spacer faces away from the gate structure and is positioned further away from the gate structure than any other edge of the spacer.

9. The method of claim 7, wherein the horizontal region has a top surface facing the gate structure and an opposing bottom surface facing away from the gate structure and extending substantially parallel with respect to the upper surface of the substrate, and
wherein the vertical region has a surface extending substantially perpendicular with respect to the upper surface of the substrate.

10. The method of claim 7, wherein the first etching includes a dry etching process and the second etching includes a wet etching process.

11. The method of claim 7, wherein the first etching includes a dry etching process that utilizes a combination of hydrogen bromide (HBr), oxygen ($O_2$), and helium (He), and
wherein the second etching includes a wet etching process that utilizes a combination of tetramethylammonium hydroxide (TMAH), isopropyl alcohol (IPA), and water ($H_2O$).

12. The method of claim 7, further comprising performing a cleaning process on the modified recess prior to filling the modified recess with the semiconductor material.

13. The method of claim 7, wherein filling the modified recess with the semiconductor material includes filling the modified recess with the semiconductor material such that an upper surface of the semiconductor material extends above the upper surface of the substrate.

14. A method comprising:
providing a substrate;
forming a gate structure on the substrate;
forming a spacer on a sidewall of the gate structure;
performing an implantation process on the substrate to form a doped region in the substrate after forming the spacer on the sidewall of the gate structure;
performing a first etching to form a recess in the substrate;
forming another spacer over the spacer and on a portion of a sidewall of the recess; and
performing a second etching to modify the recess such that the gate structure is disposed on a portion of the substrate that is T shaped.

15. The method of claim 14, wherein an outer edge of the portion is substantially coplanar with an outer edge of the spacer on the sidewall of the gate structure, wherein the outer edge of the spacer faces away from the gate structure and is positioned further away from the gate structure than any other edge of the spacer.

16. The method of claim 14, further comprising:
filling the modified recess with a material different from the substrate; and
removing the another spacer on the portion of the sidewall of the recess prior to filling the modified recess with the material.

17. The method of claim 14, wherein performing the first etching to form the recess in the substrate includes performing the first etching through the doped region.

18. The method of claim 14, wherein the first etching includes a dry etching process and the second etching includes a wet etching process.

19. The method of claim 14, wherein performing the second etching to modify the recess includes performing the second etching with an etchant, and
wherein the etchant includes at least one of tetramethylammonium hydroxide (TMAH) and isopropyl alcohol (IPA).

20. The method of claim 7, further comprising forming another spacer over the spacer and on a portion of a sidewall of the recess.

* * * * *